(12) United States Patent
Cantatore

(10) Patent No.: US 7,564,291 B2
(45) Date of Patent: Jul. 21, 2009

(54) THRESHOLD VOLTAGE ADJUSTMENT IN THIN FILM TRANSISTORS

(75) Inventor: Eugenio Cantatore, Eindhoven (NL)

(73) Assignee: Polymer Vision Limited, Eindhoven (NL)

( * ) Notice: Subject to any disclaimer, the term of this patent is extended or adjusted under 35 U.S.C. 154(b) by 0 days.

(21) Appl. No.: 11/568,083

(22) PCT Filed: Apr. 21, 2005

(86) PCT No.: PCT/IB2005/051380

§ 371 (c)(1),
(2), (4) Date: Oct. 19, 2006

(87) PCT Pub. No.: WO2005/104372

PCT Pub. Date: Nov. 3, 2005

(65) Prior Publication Data

US 2007/0273426 A1    Nov. 29, 2007

Related U.S. Application Data

(60) Provisional application No. 60/565,494, filed on Apr. 26, 2004.

(51) Int. Cl.
*G06G 7/12* (2006.01)

(52) U.S. Cl. .......................... 327/365; 327/382; 345/92
(58) Field of Classification Search ................. 327/365, 327/382; 345/92
See application file for complete search history.

(56) References Cited

U.S. PATENT DOCUMENTS

| 6,950,081 B2 * | 9/2005 | Akimoto et al. ............... 345/55 |
| 7,187,004 B2 * | 3/2007 | Miyazawa .................. 257/59 |
| 2003/0067424 A1 | 4/2003 | Akimoto et al. |
| 2003/0117352 A1 | 6/2003 | Kimura |

FOREIGN PATENT DOCUMENTS

JP    2003223138    12/2003

* cited by examiner

*Primary Examiner*—Kenneth B. Wells
(74) *Attorney, Agent, or Firm*—Leydig, Voit & Mayer Ltd.

(57) ABSTRACT

A thin film transistor circuit has a main thin film transistor (10), a control input (12) for controlling the operation of the main thin film transistor and a threshold adjustment capacitor (14) connected between the control input and the gate of the main thin film transistor. A charging circuit (16, 18) is used for charging the threshold adjustment capacitor to a desired threshold adjustment voltage. The circuit is used to affect a voltage shift to the voltage applied to the control input. This effectively implements a threshold voltage change by altering the relative voltages on the main transistor gate and the control input.

16 Claims, 5 Drawing Sheets

THRESHOLD VOLTAGE ADJUSTMENT IN THIN FILM TRANSISTORS

CROSS REFERENCE TO RELATED CASES

Applicant claims the benefits of U.S. Provisional Application Ser. No. 60/565,494, filed Apr. 26, 2004, and PCT International Application Number PCT/IB2005/051380, filed Apr. 21, 2005.

This invention relates to the adjustment of the threshold voltage of thin film transistors.

Transistor characteristics are generally defined at the design stage, and the semiconductor processes are then selected to meet the required design parameters of the transistor. For organic thin film transistors, it is difficult to control and choose the doping level of the semiconductor, the properties of the semiconductor insulator interface, and the electric purity of the dielectric insulator used. This is in part due to the simple, low temperature technology steps used, and in part due to the fact that an accurately controllable technique for doping organic semiconductors is currently not available.

As a result, the threshold voltage of organic thin film transistors in particular (or more precisely, as present organic transistor are accumulation devices, the flat band voltage) cannot be trimmed by the processing technology.

Many different electronic circuits do however rely upon predetermined threshold voltage levels for correct operation.

There is therefore a need to enable control of the threshold voltage of thin film transistors which does not rely upon the processing steps of the semiconductor technology used.

According to the invention, there is provided a thin film transistor circuit comprising:

a main thin film transistor;

a control input for controlling the operation of the main thin film transistor;

a threshold adjustment capacitor connected between the control input and the gate of the main thin film transistor; and a charging circuit for charging the threshold adjustment capacitor to a desired threshold adjustment voltage.

The circuit of the invention uses a capacitor between the control input and the gate of the main transistor to effect a voltage shift to the voltage applied to the control input. This effectively implements a threshold voltage change by altering the relative voltages on the main transistor gate and the control input.

The charging circuit may comprise a thin film transistor connected between the gate of the main thin film transistor and a threshold adjustment power line. This is used to charge the capacitor to the voltage on the threshold adjustment power line.

The main thin film transistor preferably comprises an organic thin film transistor, as threshold voltage control is particularly difficult at manufacture for such devices.

The circuit is operable in two modes:

a first, reset, mode in which the charging circuit is used to charge the threshold adjustment capacitor to a desired threshold adjustment voltage; and a second mode in which a control voltage is applied to the control input, and is coupled to the gate of the main thin film transistor through the threshold adjustment capacitor.

The reset mode can be repeated as often as necessary to account for charge leakage of the storage capacitor.

A number of the circuits of the invention may be used in an electronic circuit. This electronic circuit may for example comprise an inverter, having first and second main thin film transistor circuits of the invention connected in series between power lines. One of the thin film circuits can be associated with a first threshold adjustment voltage to reduce the threshold voltage and the other can be associated with a second threshold adjustment voltage to increase the threshold voltage. This provides improved operating characteristics of the inverter.

In another example, the electronic circuit may comprise a flip flop, having a plurality of thin film transistor circuits of the invention. In this case, each thin film circuit can be associated with a shared threshold adjustment voltage to reduce the threshold voltage to a negative value.

The invention also provides a method of controlling the threshold voltage of a thin film transistor circuit, the circuit comprising a main thin film transistor, a control input for controlling the operation of the main thin film transistor and a threshold adjustment capacitor connected between the control input and the gate of the main thin film transistor, the method comprising:

in a reset mode, charging the threshold adjustment capacitor to a desired threshold adjustment voltage; and in an operation mode, applying a control voltage to the control input, and coupling the control voltage to the gate of the main thin film transistor through the threshold adjustment capacitor.

Example of the invention will now be described in detail with reference to the accompanying drawings, in which.

As mentioned above, many different electronic circuits require threshold voltage control for correct operation. Two examples will now be given.

Figure 1:
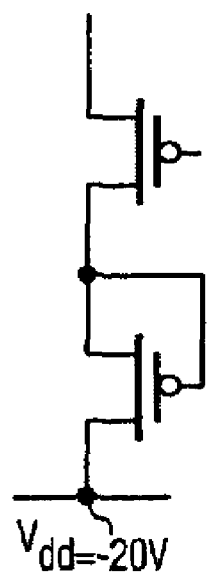
FIG. 1 shows a known inverter circuit using thin film transistors.
Figure 2:
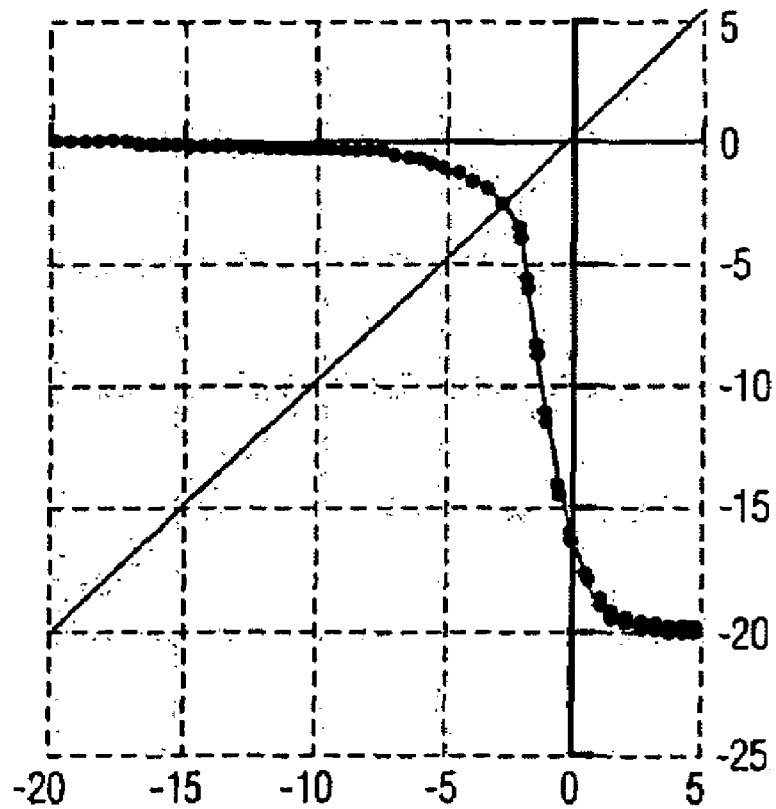
FIG. 2 shows the input-output response of the circuit of FIG. 1.

FIG. 1 shows a so-called "$V_{gs}=0$" inverter. In this inverter, the load is a transistor connected to have zero gate-source voltage. The width to length (W/L) ratio of the drive and load transistors are chosen to separate as much as possible the stable high ($V_{high}$) and low ($V_{low}$) levels at the output. FIG. 2 shows the input-output characteristic of the inverter.

The threshold voltage of p-type organic transistors is usually slightly positive (0-2V). This allows a small pull-down current in the load and provides good gain. However the small pull-down current makes the pull-down delay of such inverters extremely long, and limits the speed of this kind of logic. A slightly higher positive threshold of the load, in the range of some volts, would be beneficial for the speed, without reducing too much the gain (the gate source voltage is constant and the transistors can be regarded as a current source).

With regard to the drive transistor, the input-output characteristic of FIG. 2 is very asymmetric, causing poor noise margin in spite of the good gain. This would be improved if the threshold of the drive transistor could be negative, as the characteristic of FIG. 2 would shift to the left along the $V_{in}$ axis.

Thus, the Vgs=0 inverter would be faster and have a better noise margin if the threshold voltage of the load transistor could be positive and the threshold voltage of the drive transistor could be negative.

Figure 3:
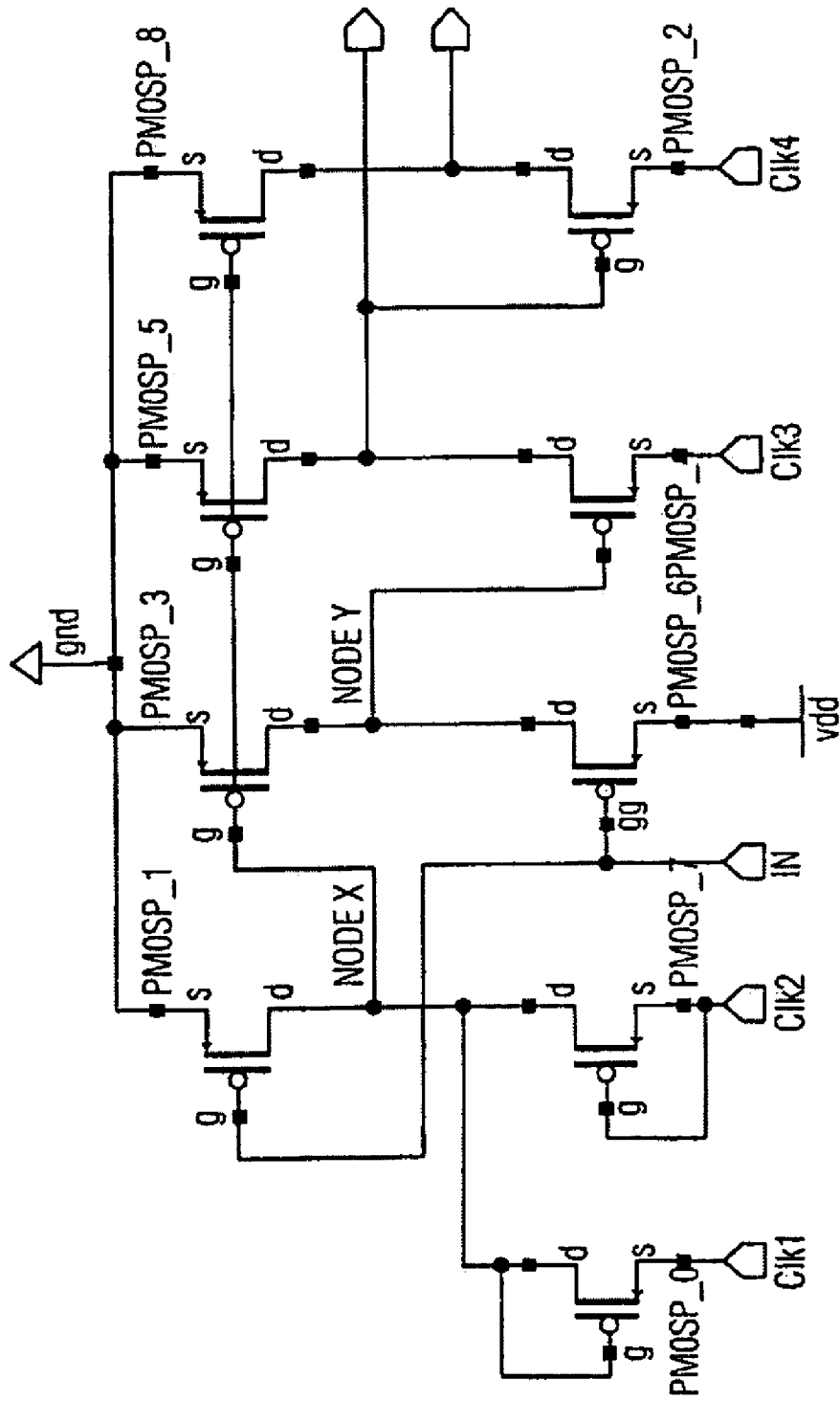
FIG. 3 shows a known flip-flop circuit.

FIG. 3 shows schematically the circuit for a dynamic flip-flop that uses only pMOS devices. Clock signals (Clk1-Clk4) are normally at 0V, and become active ($-V_{dd}$) with the appropriate timing. For proper circuit operation, for instance, when the nodes "X" and "IN" are at 0V, the impedance from node "Y" towards the power supply should be very high, so that the voltage of node "Y" is held. This requires a negative threshold for the pMOS devices, but a negative threshold is normally not available in organic technology. Similar considerations apply to node "OUT" and the signal "row". In particular, node "OUT" should be high impedance when "X" and "Y" are at 0V, and the signal "row" should be high impedance when nodes "X" and "OUT" are at 0V.

FIG. 3 is provided simply to illustrate the type of circuit in which transistor threshold voltages are important, and the operation of the circuit will not be described in detail. This will be apparent to those skilled in the art.

The two examples above show that it is desirable to be able to choose the value of transistor threshold voltages.

Figure 4:
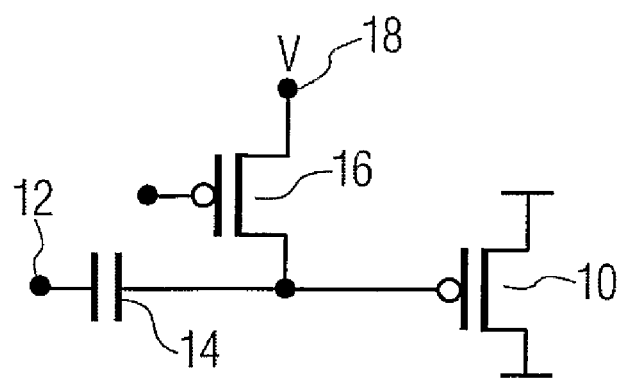
FIG. 4 shows a transistor circuit of the invention.

FIG. 4 is used to explain the basic operation of the transistor circuit of the invention.

The circuit has a main thin film transistor 10 and a control input 12 for controlling the operation of the main thin film transistor 10. A threshold adjustment capacitor 14 is connected between the control input 12 and the gate of the main thin film transistor 10. A charging circuit comprising a charging transistor 16 connected to a power line 18 is used for charging the threshold adjustment capacitor 14 to a desired threshold adjustment voltage.

This circuit uses a capacitor between the circuit input 12 and the gate of the main transistor 10 to effect a voltage shift to the voltage applied to the control input 12. This effectively implements a threshold voltage change by altering the relative voltages on the main transistor gate and the control input.

The transistors may comprise organic thin film transistors, as threshold voltage control is particularly difficult at manufacture for such devices.

The circuit of FIG. 4 is operable in two modes. In a reset mode, the charging circuit 16, 18 is used to charge the threshold adjustment capacitor 14 to a desired threshold adjustment voltage. In an operation mode, a control voltage is applied to the control input 12, and this is coupled to the gate of the main thin film transistor through the threshold adjustment capacitor 14. The use of reset states is well known within digital and analogue systems, for example in shift registers, counters, finite state machines, RF and D/A or A/D conversion circuitry.

The capacitor 14 is charged to a given voltage V from the power line 18 during the reset state and will keep this voltage during normal circuit operation (while the circuit evolves through all the other states). The voltage on the capacitor 14 will result in a shift of the effective threshold voltage of V (which can be positive of negative).

The transistor 16 is on during the reset phase, to charge the gate to the voltage V on the line 18. The voltage on the input 12 should also be fixed during the reset phase (for example 0V), so that the voltage across capacitor 14 is uniquely defined at reset.

After the reset phase, transistor 16 is turned off (in depletion), to keep the charge on the gate and maintain the capacitor voltage during normal operation. The capacitor 14 should be large enough to keep the voltage V during normal operation despite charge injection via the parasitic transistor capacitances to the gate and charge leakage through transistor 16. The charge on the capacitor 14 can be refreshed during any reset phase.

The reset mode can be repeated as often as necessary to account for these charge leakages from the storage capacitor.

The circuit described with reference to FIG. 4 can be used to change the threshold voltage of the drive and load transistors in FIG. 1. This leads to the inverter shown in FIG. 5.

In this circuit, capacitance C0 shifts the threshold of the drive transistor 50, while capacitance C1 shifts the threshold of the load transistor 52. Thus, the drive transistor 50 is associated with power line 56 and the transistor $16_0$, and the load transistor 52 is associated with power line 58 and the transistor $16_1$. The voltage over the capacitances can be separately chosen. The additional transistor 54 is provided to pull-up the output node to 0V during the reset phase. This gives a reference for the charge of capacitances C0 and C1. During the reset, any "in" and "out" node is at 0V, so that the voltage on the power line 56 will be chosen positive and the voltage on the power line 58 will be negative. This then improves the operating characteristics of the inverter.

Figure 5:
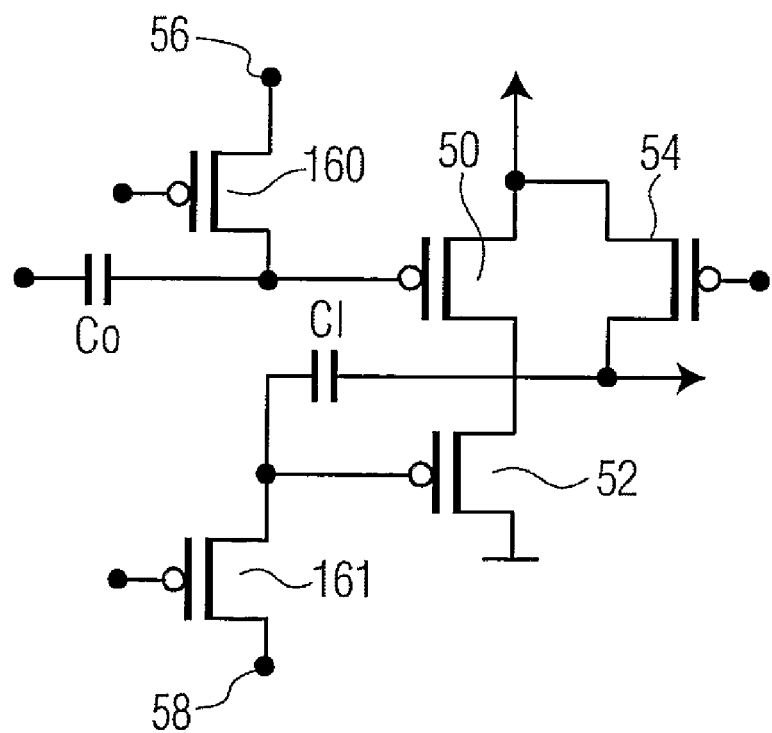
FIG. 5 shows an inverter circuit using transistor circuits of the invention.
Figure 6:
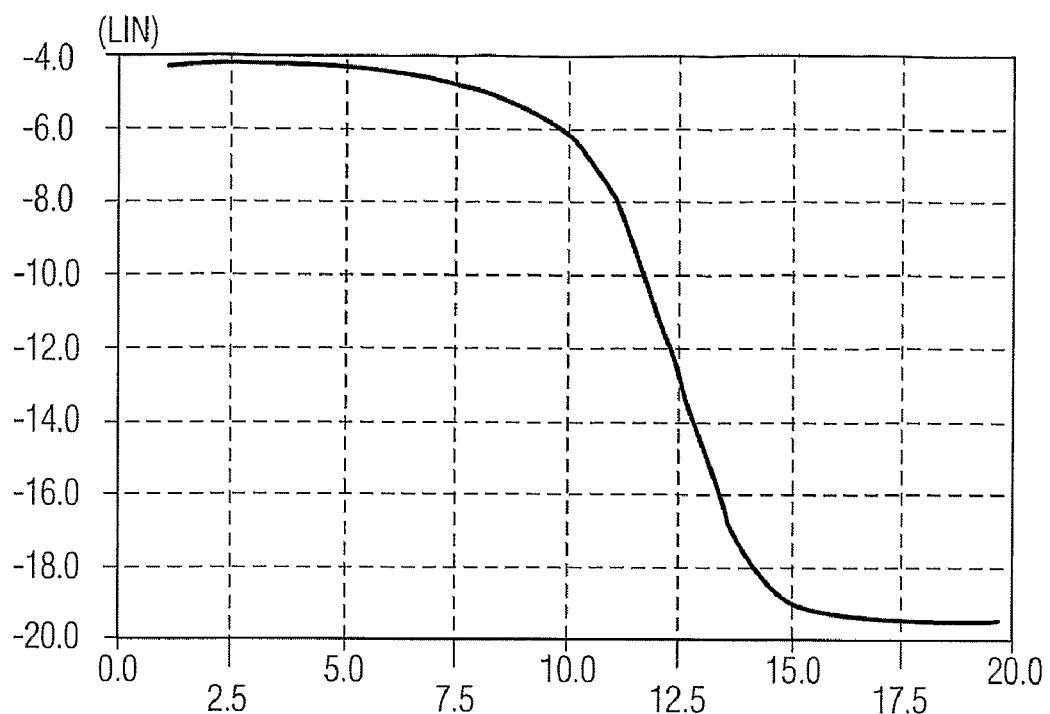
FIG. 6 shows the input-output response of the circuit of FIG. 5
Figure 7:
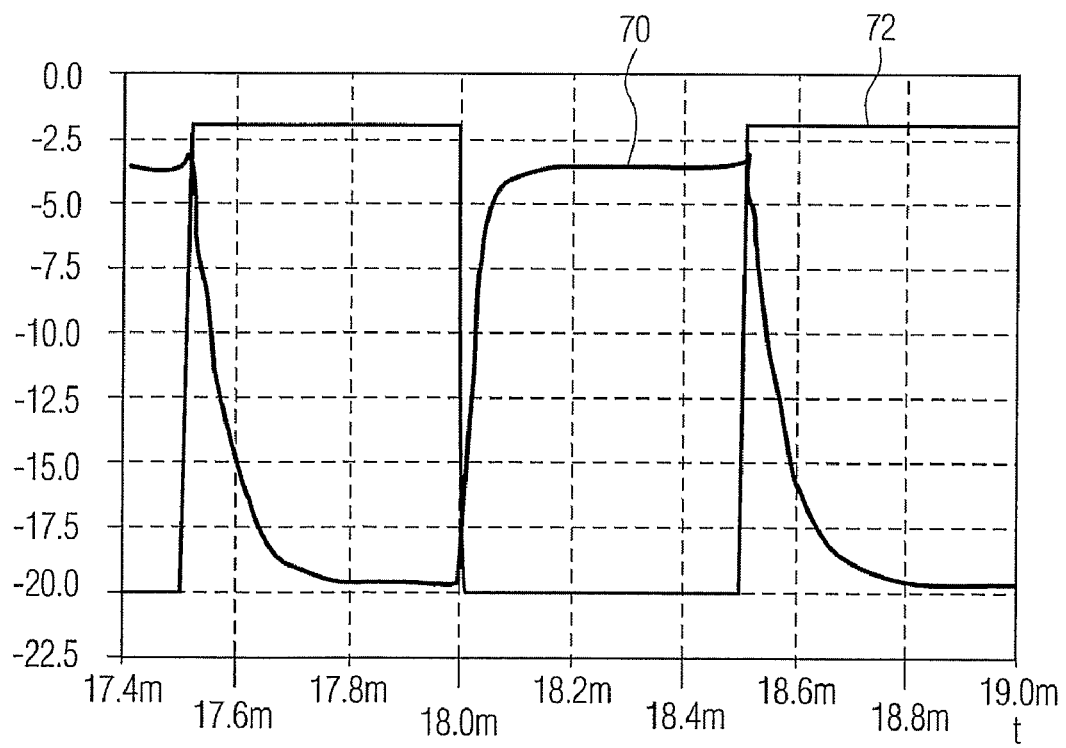
FIG. 7 shows the temporal response of the circuit of FIG. 5.

FIG. 6 shows the static input-output characteristics of the inverter of FIG. 5 and FIG. 7 shows and the dynamic response 70 of this inverter to a square wave 72. By choosing suitable values for the voltages on the power lines 56 and 58, a symmetric and fast (for organic electronics) dynamic response can be achieved together with a good noise margin.

Figure 8:
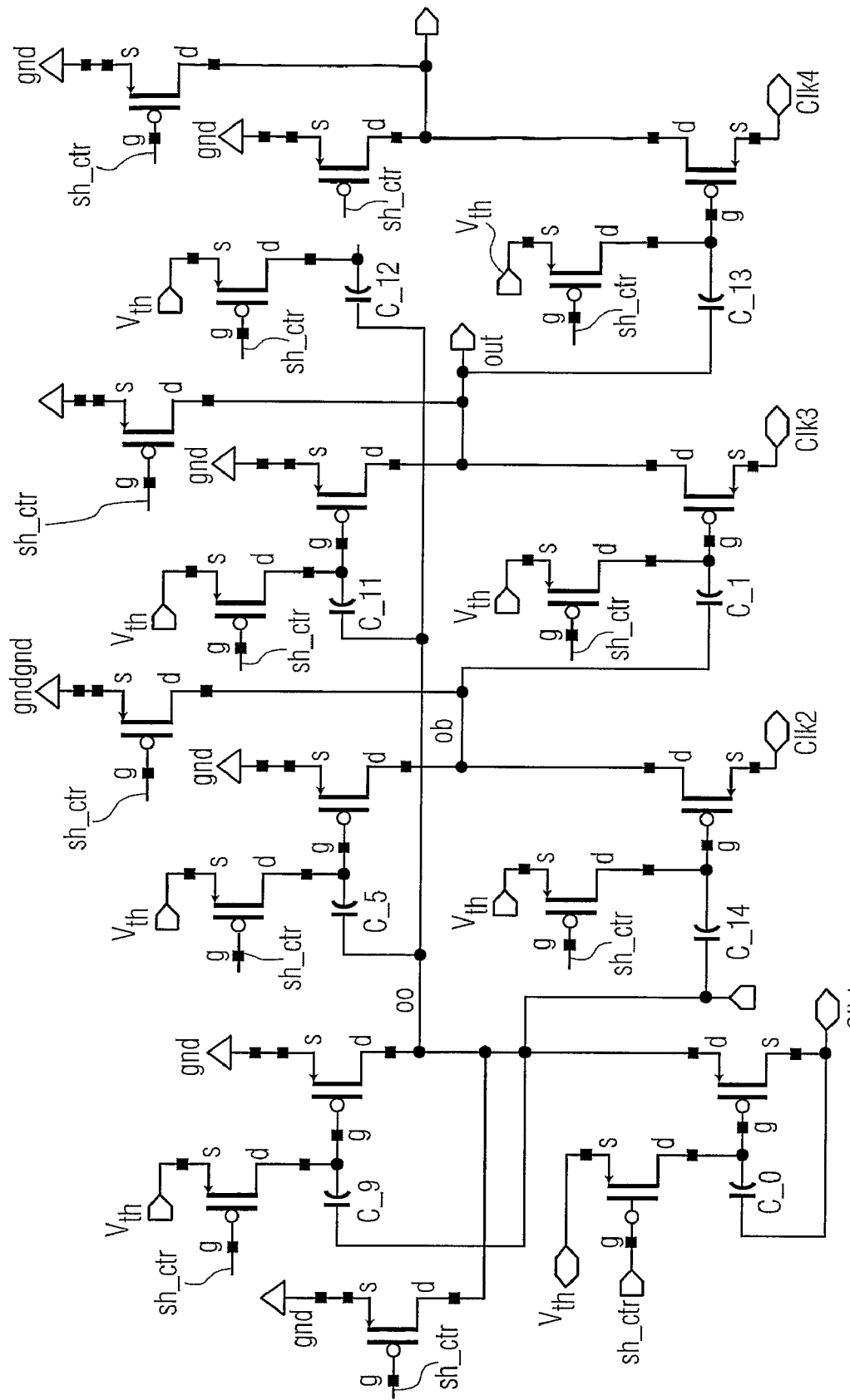
FIG. 8 shows a flip flop circuit using transistor circuits of the invention.

Applying the basic circuit of FIG. 4 to the dynamic flip-flop of FIG. 3 results in the dynamic flip-flop of FIG. 8. In this circuit, the effective threshold of all transistors can be modified to become negative by choosing the voltage "$V_{th}$". In this way the problems caused by the positive transistor threshold voltage explained above can be overcome.

Many other circuits can be made using the building blocks provided by the invention. For example, a shift register can be based on inverter logic elements as described above.

In organic thin film transistors, as well as in other technologies, such as amorphous silicon, the threshold voltage is not stable when the transistors are electrically biased. The phenomenon is known as bias stress, and it is a serious challenge to the use of organic transistors even in digital circuits. It is in fact extremely difficult to design circuits that are very insensitive to the value of the threshold voltage, and consequently that are robust against bias stress. More specifically, in p-type organic transistors using polymeric insulators, the bias stress measured in air has the following characteristics:

A negative voltage applied to the gate causes the transistors to have a more positive threshold; a positive voltage applied to the gate moves the threshold to more negative values. The amount of shift is approximately proportional to the magnitude of the applied stress.

The time constant of the threshold shift is similar whether a positive or a negative voltage is applied to the gate, and the shift is reversible (applying a negative gate voltage for a given time, and a positive gate voltage for the same time results in a very small residual shift).

The threshold shift can also be recovered in absence of any bias, but the time constant of this relaxation process is much longer than that of the shift itself (approximately 1 day of relaxation is needed to recover from 1 hour of negative gate stress).

When a voltage is applied only to the drain, a reduced threshold shift is expected, as the region of the channel that is subject to a vertical field is a small portion of the total channel area.

The invention can be applied in such a manner to counteract bias stress. The threshold that shifts during circuit operation due to bias stress can be brought back to a suitable value by varying the voltage shift introduced to take account of the voltage shift of the threshold voltage.

In addition, the switch 16 used in FIG. 4 to charge the main transistor gate is used alternatively with a small positive gate bias for a relatively long time, during normal operation and a large negative gate bias for a small time, during the reset phase. The two effects will partially cancel. Moreover, the gate of the transistor 16 is accessible from outside the circuit, and the bias voltages that are applied there can be adjusted during circuit operation, to adapt to residual threshold variations.

Circuits based on organic electronics are particularly suitable for large area and/or low cost applications. The current main interest is in fabricating active matrix back planes for flexible displays based on organic transistors. These back planes need integrated drivers to ensure robustness, proper form factor and low cost. Integrated display drivers are a typical example of application where the systems will have a periodic reset phase. This invention can also be applied to Radio Frequency ID tags, which also use a periodic reset phase, and which are known implemented using organic electronics.

Amorphous silicon TFTs also suffer from electric stress in a similar way to that described for organic transistors (the direction of the threshold shift is opposite). The invention can thus be applied to circuits made with a-Si to compensate for the effects of bias stress.

Although two examples of circuit have been given, the invention can be used to provide desired operation of one or more thin film transistors by controlling the effective threshold voltage within any circuit. As mentioned above, the invention is most applicable to organic thin film transistors. These have at least one of the functional layers (the gate conductor, the insulator, the source/drain conductor or the semiconductor) containing an organic (carbon based) material.

In this description and claims, the term "threshold voltage" is intended to cover the "flat band voltage" in cases where this term is more appropriate.

The invention enables a shift in the effective threshold voltage of a thin film transistor. This is in contrast with known circuits which provide compensation for changes in threshold voltage. In particular, the threshold adjustment voltage can be selected independently of any variations in the actual threshold voltage of the main transistor. Instead, the invention implements a more macroscopic shift in effective threshold voltage, for example from a positive to a negative value. Alternatively, the invention can be used to increase significantly the effective threshold voltage, thereby providing depletion device operation ($V_t \gg 0$) when the main transistor has accumulation device characteristics ($V_t > 0$).

The invention enables the noise margin of devices to be improved, and this can contribute to an increase in yield.

The circuit of the invention can be supplemented with dynamic threshold voltage control in order to overcome the effects of voltage stress. This can be achieved by measuring the threshold voltage and changing the threshold voltage adjustment level.

The examples above give p-type implementations, where the transistors have positive threshold voltages. The invention can equally be used to shift a threshold voltage from a negative value to a positive value. This may be appropriate for n-type transistors, and these may also be organic transistors or they may be amorphous silicon transistors.

Various modifications will be apparent to those skilled in the art.

The invention claimed is:

1. An electronic circuit comprising an inverter having first and second thin film transistor circuits connected in series between power lines, the first and second thin film transistor circuits each comprising:
   a main thin film transistor;
   a control input for controlling the operation of the main thin film transistor;
   a threshold adjustment capacitor connected between the control input and a gate of the main thin film transistor; and
   a charging circuit for charging the threshold adjustment capacitor to a desired threshold adjustment voltage.

2. A circuit as claimed in claim 1, wherein the charging circuit comprises a thin film transistor connected between the gate of the main thin film transistor and a threshold adjustment power line.

3. A circuit as claimed in claim 1 or 2, wherein the main thin film transistor comprises an organic thin film transistor.

4. A circuit as claimed in claim 1 or 2, wherein the circuit is operable in two modes:
   a first, reset, mode in which the charging circuit is used to charge the threshold adjustment capacitor to a desired threshold adjustment voltage; and
   a second mode in which a control voltage is applied to the control input, and is coupled to the gate of the main thin film transistor through the threshold adjustment capacitor.

5. An electronic circuit as claimed in claim 1, wherein the first thin film circuit is associated with a first threshold adjustment voltage to reduce the threshold voltage and the second thin film circuit is associated with a second threshold adjustment voltage to increase the threshold voltage.

6. An electronic circuit as claimed in claim 5, wherein the charging circuit comprises a thin film transistor connected between the gate of the main thin film transistor and a threshold adjustment power line.

7. An electronic circuit as claimed in claim 5, wherein the main thin film transistor comprises an organic thin film transistor.

8. An electronic circuit as claimed in claim 5, wherein the circuit is operable in two modes:
   a first, reset, mode in which the charging circuit is used to charge the threshold adjustment capacitor to a desired threshold adjustment voltage; and
   a second mode in which a control voltage is applied to the control input, and is coupled to the gate of the main thin film transistor through the threshold adjustment capacitor.

9. An electronic circuit comprising a flip flop, having a plurality of thin film transistor circuits, each thin film transistor circuit comprising:
   a main thin film transistor;
   a control input for controlling the operation of the main thin film transistor;
   a threshold adjustment capacitor connected between the control input and a gate of the main thin film transistor; and
   a charging circuit for charging the threshold adjustment capacitor to a desired threshold adjustment voltage.

10. An electronic circuit as claimed in claim 9, wherein each thin film circuit is associated with a shared threshold adjustment voltage ($V_{th}$) to reduce the threshold voltage from a positive to a negative value or to increase the threshold voltage from a negative to a positive value.

11. An electronic circuit as claimed in claim 9, wherein the charging circuit comprises a thin film transistor connected between the gate of the main thin film transistor and a threshold adjustment power line.

12. An electronic circuit as claimed in claim 10, wherein the charging circuit comprises a thin film transistor connected between the gate of the main thin film transistor and a threshold adjustment power line.

13. An electronic circuit as claimed in claim 9, wherein the main thin film transistor comprises an organic thin film transistor.

14. An electronic circuit as claimed in claim 10, wherein the main thin film transistor comprises an organic thin film transistor.

15. An electronic circuit as claimed in claim 9, wherein the circuit is operable in two modes:

a first, reset, mode in which the charging circuit is used to charge the threshold adjustment capacitor to a desired threshold adjustment voltage; and a second mode in which a control voltage is applied to the control input, and is coupled to the gate of the main thin film transistor through the threshold adjustment capacitor.

16. An electronic circuit as claimed in claim 10, wherein the circuit is operable in two modes:

a first, reset, mode in which the charging circuit is used to charge the threshold adjustment capacitor to a desired threshold adjustment voltage; and a second mode in which a control voltage is applied to the control input, and is coupled to the gate of the main thin film transistor through the threshold adjustment capacitor.

* * * * *